United States Patent [19]
Efland et al.

[11] Patent Number: 5,665,991
[45] Date of Patent: Sep. 9, 1997

[54] DEVICE HAVING CURRENT BALLASTING AND BUSING OVER ACTIVE AREA USING A MULTI-LEVEL CONDUCTOR PROCESS

[75] Inventors: Taylor R. Efland, Richardson; Satwinder Malhi, Garland; Michael C. Smayling, Missouri City; Joseph A. Devore; Ross E. Teggatz, both of Dallas; Alec J. Morton, Plano, all of Tex.

[73] Assignee: Texas Instruments Incorporated, Dallas, Tex.

[21] Appl. No.: 456,238

[22] Filed: May 31, 1995

Related U.S. Application Data

[62] Division of Ser. No. 850,601, Mar. 13, 1992.

[51] Int. Cl.$^6$ .................... H01L 23/522; H01L 23/528
[52] U.S. Cl. .................... 257/335; 257/341; 257/343; 257/758
[58] Field of Search .................... 257/207, 211, 257/328, 335, 337, 339–343, 758–760

[56] References Cited

U.S. PATENT DOCUMENTS 5,025,299  6/1991  Arnould .................... 257/207
5,100,812  3/1992  Yamada et al. .................... 437/31
5,111,276  5/1992  Hingarh et al. .................... 357/71

FOREIGN PATENT DOCUMENTS

0 072 690   2/1983  European Pat. Off. ........ H01L 21/90
0343269   11/1989  European Pat. Off. ........ H01L 21/90
0296757   12/1986  Japan .................... 257/758

Primary Examiner—Peter Toby Brown
Attorney, Agent, or Firm—Ronald O. Neerings; Richard L. Donaldson

[57] ABSTRACT

The device has a semiconductor chip having active circuitry in the face thereof. The circuitry has busing over it containing two conductive layers having a plurality of contacts and vias with spacings between them that alternate with respect to one another to provide current ballasting and improved switching uniformity. The spacings between the alternating contacts and vias provide regions of maximum conductor thickness and therefore reduces the busing resistance. Staggering the rows of alternating contacts and vias provides further current ballasting. A first conducting layer is used to contact and provide electrically isolated low resistive conducting paths to the various semiconductor regions while the second conducting region is used to provide selective contact to the first conductive layer, thus providing a means of busing large currents over active semiconductor area without sacrificing performance parameters.

7 Claims, 13 Drawing Sheets

DEVICE HAVING CURRENT BALLASTING AND BUSING OVER ACTIVE AREA USING A MULTI-LEVEL CONDUCTOR PROCESS

This is a divisional of application Ser. No. 07/850,601, filed Mar. 13, 1992.

FIELD OF THE INVENTION

This invention is in the field of integrated circuits, and is more specifically directed to multi level conductive buses for current distribution over power integrated circuits.

BACKGROUND

In the field of power integrated circuits a host of unique problems confront designers. One such problem is nonuniform current distribution in bus routing, leading to potential reliability problems due to electromigration and resulting in poor safe operating area performance (hereafter referred to as SOA). Nonuniform current distribution can be caused by metal thinning, metal voiding or poor step coverage along the bus. These may create hot spots (regions of simultaneous high voltage and high current) on the semiconductor die which in turn can create potential reliability problems when operating semiconductor devices at high power levels.

Another primary area of concern is die area. As designers strive to design higher performance circuits at lower cost the busing used to carry current to and from power transistors becomes a primary factor. Large current quantities require wide buses to meet the current density specifications. These buses require a significant amount of die area with the problem becoming compounded with devices having multiple conducting regions, multiple surface electrodes, or a combination of both multiple conducting regions and multiple electrodes on the surface.

It is an object, therefore, of this invention to provide an improved bus structure for a power integrated circuit device.

Other objects and benefits of this invention will be apparent to those of ordinary skill in the art having reference to the following drawings and description herein.

SUMMARY OF THE INVENTION

An integrated circuit device such as a power integrated circuit with a multi-level conductor system employing an alternating pattern of contacts and vias with spacings between them facilitates uniform current distribution (current ballasting) along metal buses, thus improving circuit reliability while decreasing die size by busing over active circuit area. The unique layout of the multi-level conductor system also allows significant switching improvement for MOS type devices by decreasing the associated resistance and capacitance in gate polysilicon contacts. A transistor employs the multi-level conductor system with an alternating pattern of contacts and vias with spacings between them. The first conductive layer is isolated from the active circuitry by an insulating layer and makes contact down to the circuitry through a pattern of contacts. A second insulating layer then covers the first conductive layer and has a pattern of via openings etched into it so that the second conductive layer can make contact down to the first conductive layer. The patterns of contacts and vias with spacings between them alternate with respect to each other to facilitate current ballasting. The system of contacts allows for contacting all electrode types (such as the source, drain, gate, collector, base, or emitter) of a transistor. The second conductive layer, through the use of vias, can then selectively contact any of the electrodes while bridging over the other electrodes. This feature allows for current busing of one electrode to be run over top of another electrode while remaining electrically isolated. The spacings between the contacts and vias provide regions of maximum conductor thickness and therefore makes the busing structure less resistive.

DETAILED DESCRIPTION OF THE PREFERRED EMBODIMENT

Figure 1:
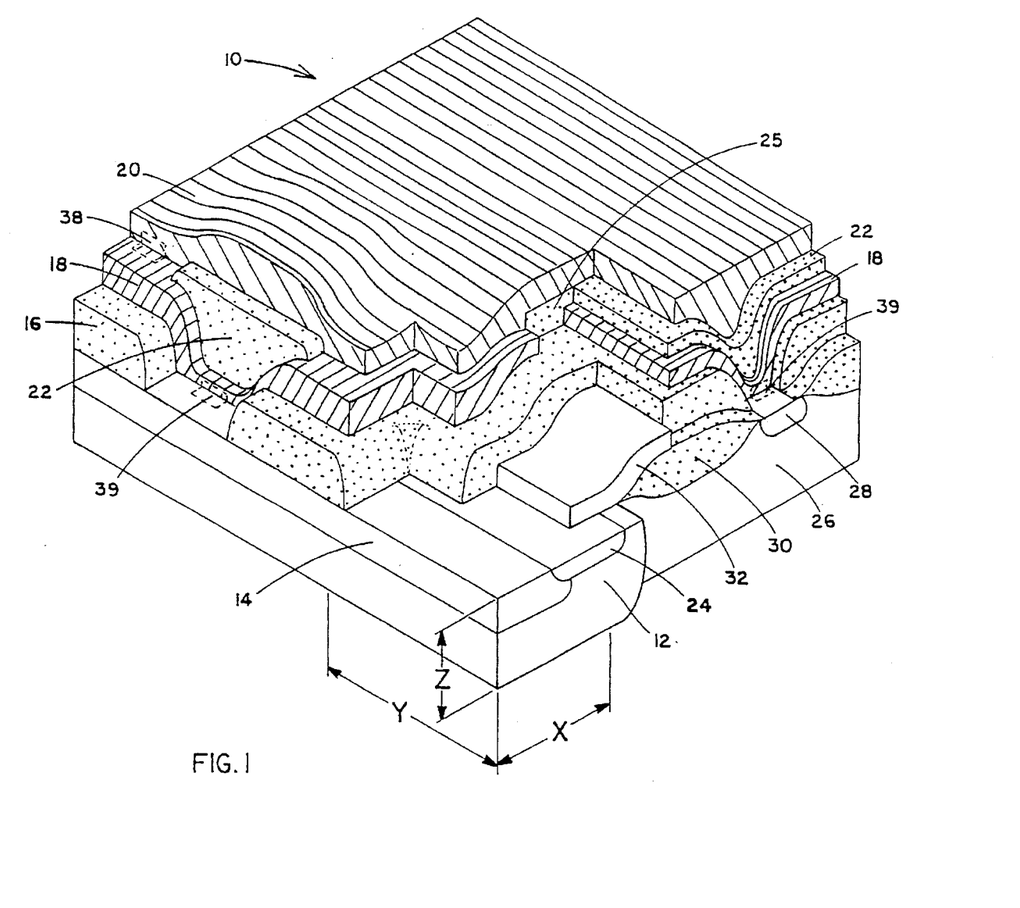
FIG. 1 is a three dimensional drawing illustrating a lateral double diffused MOS transistor (LDMOS) incorporating the preferred embodiment of the invention.
Figure 2:
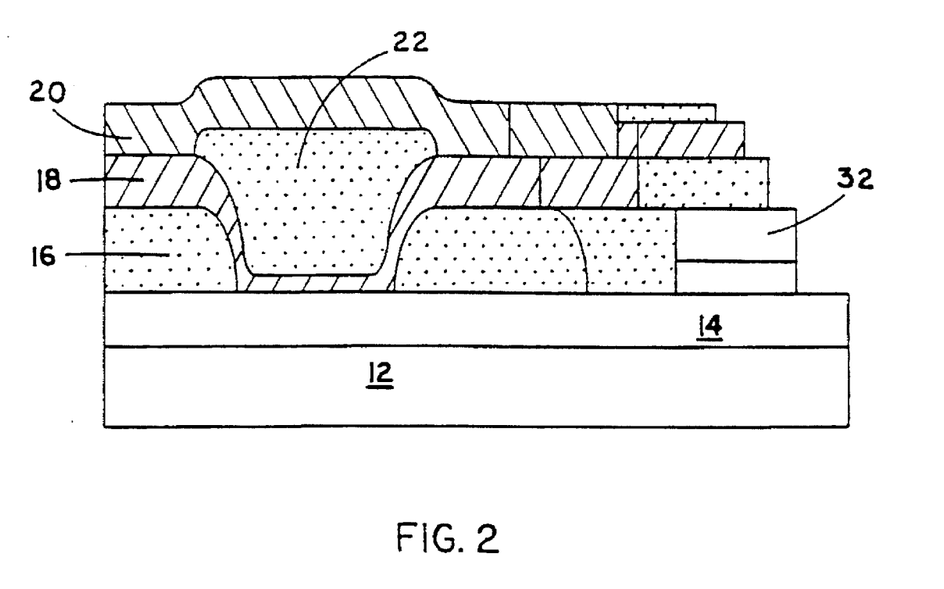
FIG. 2 is a two dimensional cross section drawing (Y–Z plane) of the LDMOS transistor of FIG. 1.
Figure 3:
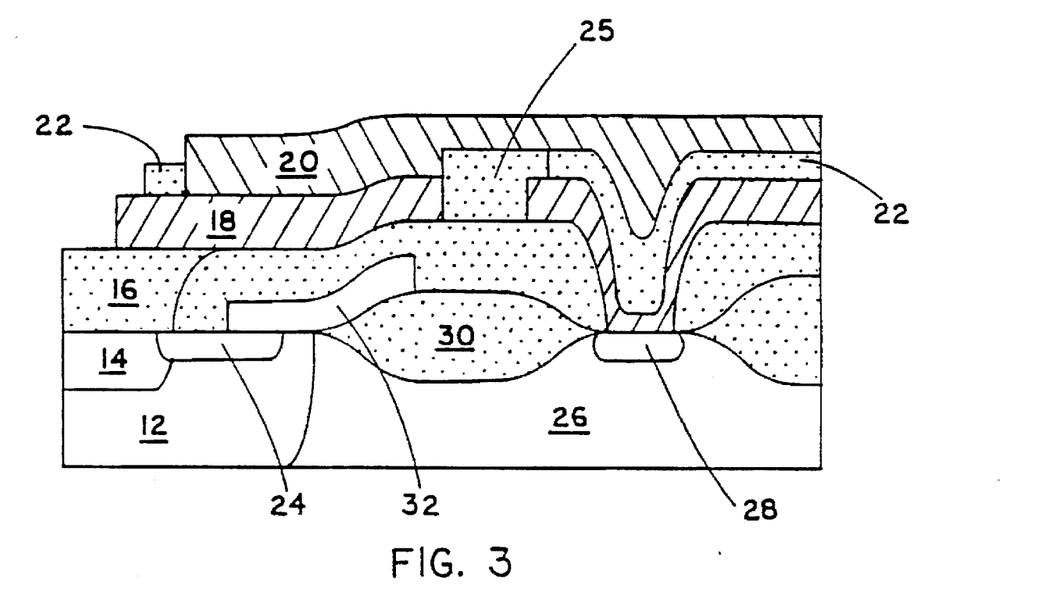
FIG. 3 is a two dimensional cross section drawing (X–Z plane) of the LDMOS transistor of FIG. 1.

FIG. 1 is a three dimensional cross section of an integrated circuit 10 employing a double level metal process, specifically a lateral double diffused MOS power transistor (hereafter referred to as an LDMOS transistor). FIG. 2 more clearly illustrates FIG. 1 by displaying a two dimensional cross section of FIG. 1 in the "Y–Z" plane. FIG. 3 also clarifies FIG. 1 by displaying a two dimensional cross section of FIG. 1 in the "X–Z" plane. The preferred embodiment of the invention may be incorporated onto an LDMOS transistor 10 (it should be noted that the LDMOS fabrication description is used as an example to illustrate the disclosed invention and is not unique in itself).

In FIG. 1 a semiconductor substrate (not shown) has an epitaxial, epi, layer 26 grown on it. A backgate 12 is then diffused as well as a source diffusion 24 and a drain diffusion 28. Segment 14 is a heavily doped diffusion allowing contact to the backgate 12. Generally, the source 24 and backgate 12 and 14 are shorted together by a first conductive layer 18 for normal operation and are referred to as the source region hereafter. Field oxide 30 is formed over the wafer surface by a standard LOCOS process. Subsequently, a thin gate oxide is grown over all exposed silicon areas. The gate oxide is not shown in FIG. 1 because it is typically very thin compared to the other layers. Polysilicon 32 is then deposited to form the transistor gate. A second oxide 16, or insulation layer is then deposited over the wafer. Openings are etched into it so that a first metal layer 18 can make selective contact down to the source diffusions 12 and 24, the drain diffusion 28, or the polysilicon gate 32. This metal layer 18 is deposited on top of the second oxide 16 and forms the contacting regions 39 to the drain 28, source 12 and 24, or polysilicon gate 32 regions. After the first metal layer 18 is patterned and etched to form the respective electrodes, each region (the drain 28, the source region 12 and 24, and the polysilicon gate 32) remains electrically isolated from each other due to the oxide layers 16 and 30 formed earlier. A third oxide layer 22 is then deposited which fills in the spaces and covers the first metal layer 18. Next, vias are etched to allow selective electrical contact to be made between the first metal layer 18 and a second metal layer 20. A second metal layer 20 is deposited on top of the third oxide layer 22.

FIG. 1 illustrates the first metal layer 18 making contact 39 down to the source region 14 and 24 and the drain region 28. The first metal layer 18 produces separate source and drain busing by having oxide separations 25 between different conducting regions of first metal layer 18. The second metal layer 20 contacts the first metal layer 18 through vias 38 in the source region, making electrical contact to the source diffusions 14 and 24. The second metal layer 20 passes over the polysilicon gate 32 and the drain 28 electrodes without contacting them. The second level metal 20, in this role, forms the source bus over active device area. At the same time the drain 28 is allowed sufficient busing through the first metal layer 18. This method of using the second metal layer 20 to selectively contact a first metal layer electrode through the vias 38 and run over active device area can be used with different diffusions such as the drain 28.

Figure 4:
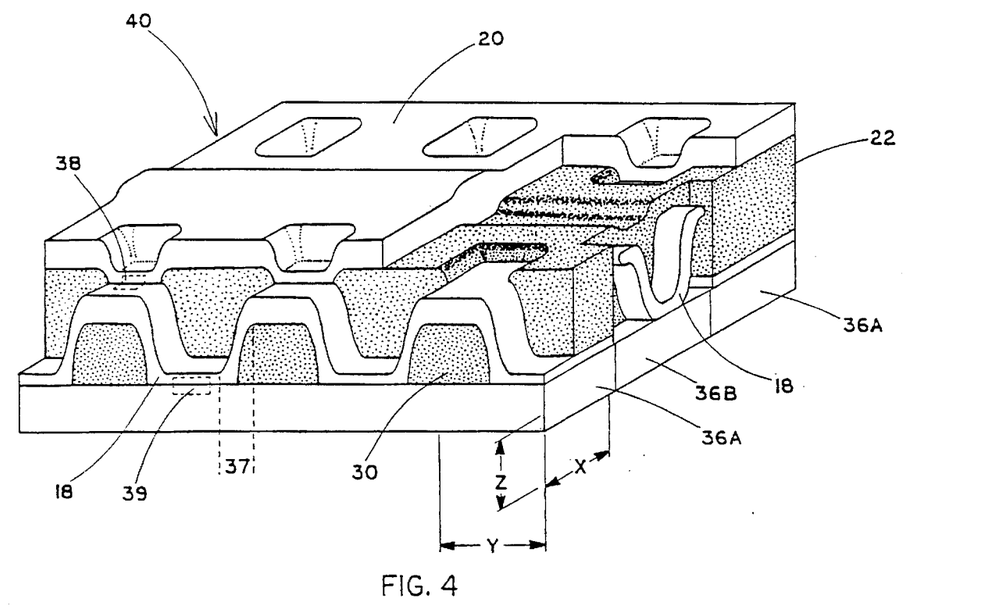
FIG. 4 is a three dimensional drawing illustrating the preferred embodiment of the invention.
Figure 5:
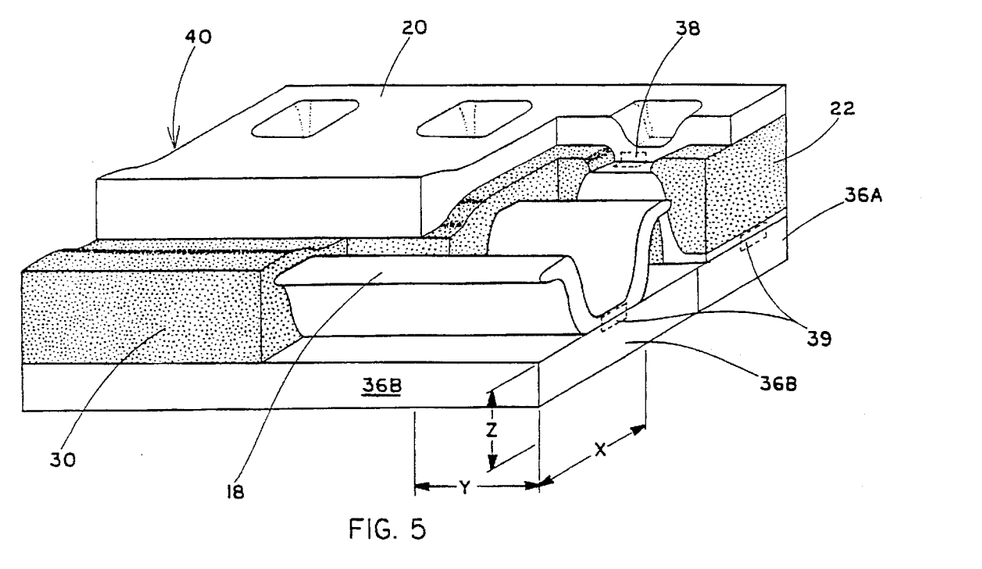
FIG. 5 is a three dimensional drawing illustrating a portion of the preferred embodiment of the invention.

FIG. 4 is a three dimensional cross section drawing illustrating the preferred embodiment of the invention. A semiconductor die 40 has active circuitry 36a and 36b formed in a face thereof. Active circuitry 36a and 36b may comprise, for example, an LDMOS transistor. An oxide layer 30 covers the active circuitry 36a and 36b and is later etched to provide openings for contact 39 down to the active circuitry. A first metal layer 18 is then deposited and patterned and makes contact 39 down to the active areas. Another oxide layer 22 is then deposited and vias 38 are etched therein to enable a second metal layer 20 to be deposited and make selective connection down to the first metal layer 18 through the vias 38. The contacts 39 and vias 38 lie over the active circuitry 36a and 36b and alternate with respect to each other with spacings 37 between the contacts 39 and vias 38. The system of alternating contacts 39, vias 38, and spacings 37 provide current ballasting by redistributing the current between the conducting layers 18 and 20. FIG. 5 is a three dimensional drawing that further illustrates the preferred embodiment of the invention. FIG. 5 is a partial cutaway of FIG. 4 to expose active circuitry 36b in the Y-Z plane and its interactions with the multi-level metal system. The first metal layer 18 makes contact 39 down to the active circuitry in both regions 36a and 36b. However, the two regions 36a and 36b are electrically isolated from one another by the presence of an oxide layer 22 which is deposited after the first metal layer 18. A second metal layer 20 is then deposited over the oxide layer 22 and makes selective contact to the first metal layer 18 through the vias 38. Note that the second metal layer 20 makes electrical contact to circuitry 36a through a via 38 to the first metal layer 18 and through a contact 39 down to the circuitry 36a, but does not make electrical contact to circuitry 36b thus leaving the active circuitry in 36a and 36b electrically isolated from one another. The second metal layer 20 then passes over the first metal layer 18 that makes electrical contact to circuitry in 36b while remaining electrically isolated from the circuitry in 36b and thus active busing is achieved.

Figure 6:
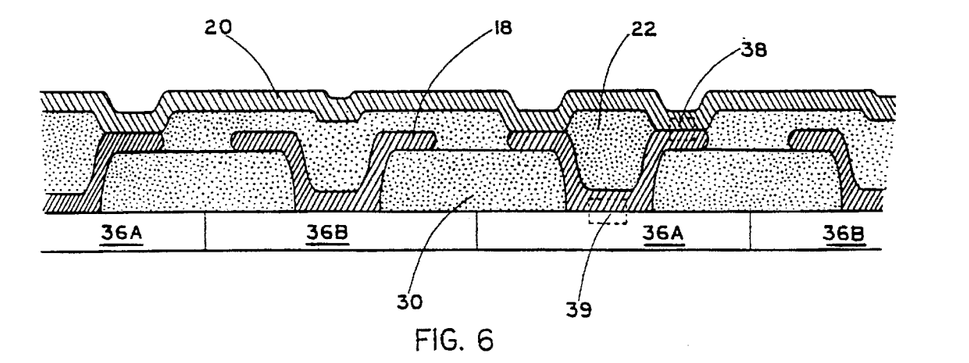
FIG. 6 is a two dimensional cross section drawing (X–Z plane) of FIG. 4.

FIG. 6 is a two dimensional cross section drawing of the X-Z plane of FIG. 5. The second metal layer 20 passes over the first metal layer 18 connected to region 36b. Regions 36a and 36b, therefore, remain electrically isolated from one another. Regions 36a and 36b, for example, can represent drain diffusions or source diffusions of a MOS transistor.

Figure 7:
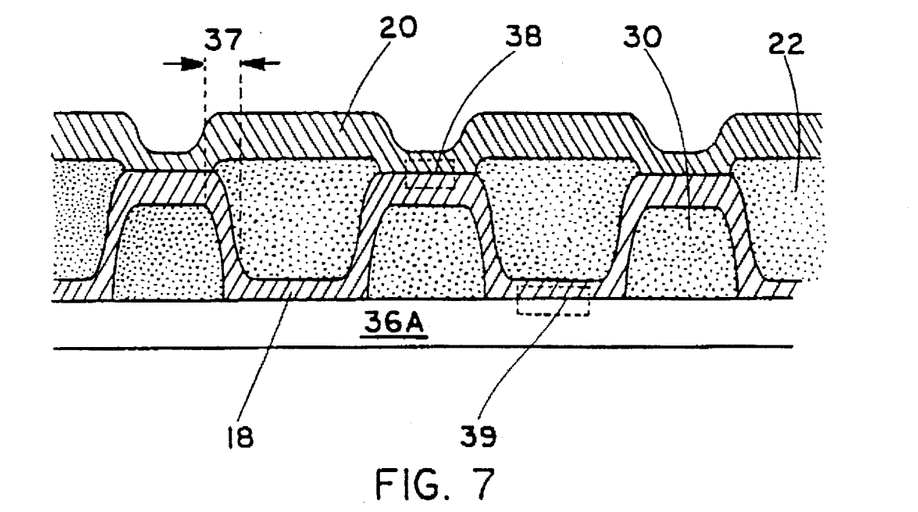
FIG. 7 is a two dimensional cross section drawing (Y–Z plane) of FIG. 4.

FIG. 7 is a two dimensional cross section drawing of the Y-Z plane of FIG. 5 and more clearly illustrates the alternating pattern of contacts 39 and vias 38 of the two metal layers 18 and 20. A single uniform diffusion 36a may represent either the drain or the source diffusion of an LDMOS transistor. The first metal layer 18 makes contact 39 down to the diffusion 36a through the openings in the first oxide layer 30. The second metal layer 20 then makes contact to the first metal layer 18 through the via openings 38 in the second oxide layer 22. The contacts 39 and vias 38 are alternated in this fashion to eliminate the double metal thinning problem caused from coincident metal step coverage thinning which is well known and understood by those skilled in the art. The region 37 represents the spaces between the contacts 39 and the vias 38 where maximum metal coverage exists. The first metal layer 18 and the second metal layer 20 are at their nominal thicknesses and provide a current path that is less resistive than would otherwise be provided. In this role the system of alternating contacts and vias with spacings between them promotes current ballasting.

A significant difference between FIG. 1 and FIGS. 4-7 is that FIG. 1 shows specifically an LDMOS transistor utilizing the innovative alternating contacts 39 and vias 38 with spacings while FIGS. 4-7 illustrate a plurality of alternating contacts 39 and vias 38 for the purpose of providing contact to any electrode of any semiconductor power device type. For power transistors that have, for example, multiple long diffusion patterns, or fingers, (multiple drain, source, collector, base, or emitter diffusions), the pattern of contacts 39 and vias 38 with spacings can run in two dimensions. The pattern can run in one dimension along the length of a diffusion and in a second dimension across the multiply placed fingers. Since the second metal layer 20 makes selective contact down to the first metal layer 18 through the vias 38 the different diffusions (such as a source and drain of a MOS transistor) remain electrically isolated. This may be more clearly seen and understood in FIG. 8a.

Figure 8A:
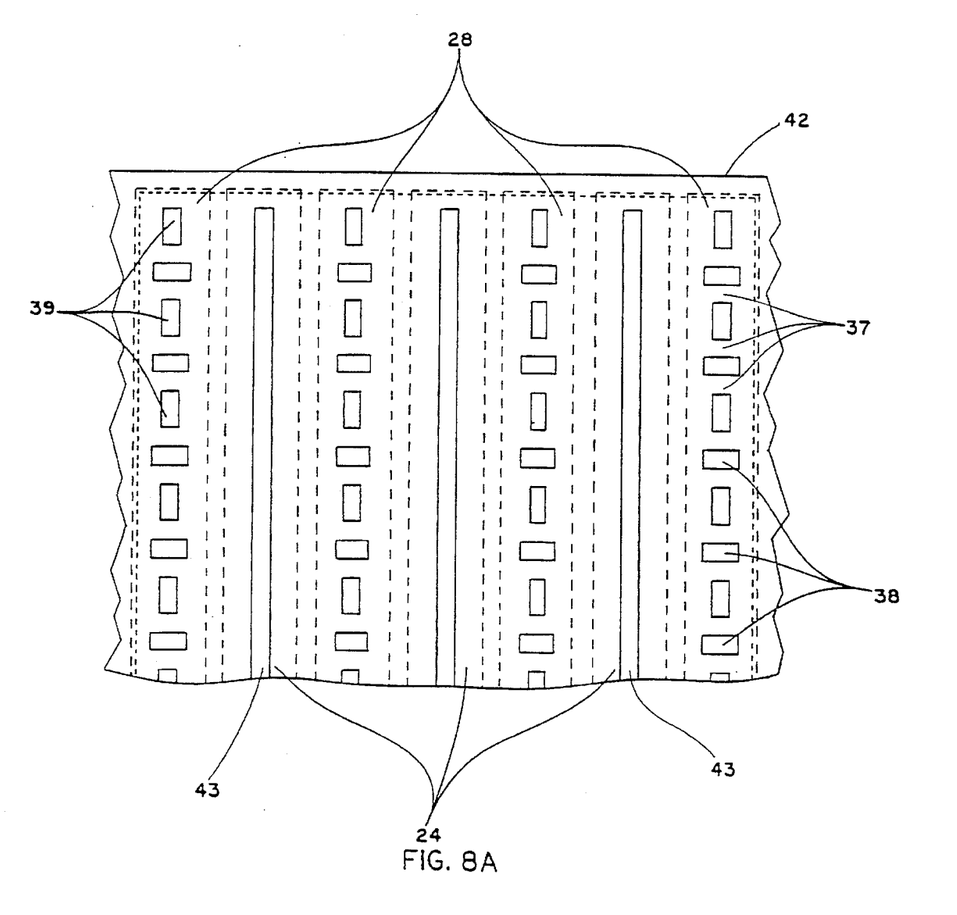
FIG. 8a is a top view drawing illustrating the preferred embodiment of the invention applied on an LDMOS transistor.

FIG. 8a is a top view of the active busing drain region 42 of a lateral DMOS power transistor incorporating the preferred embodiment of the invention (this figure could also represent an active bus source region where the direction of current flow would be reversed). The active busing drain region 42 comprises multiple drain diffusions 28 and source diffusions 24 with a first metal layer (not shown in figure, only interactions with the first metal layer are noted in the figure) making contact down to the drain diffusions 28 through the pattern of contacts 39, and a second metal layer 20 making contact to the first metal layer through a pattern of vias 38. With a large enough positive voltage placed on the gate terminal (not shown in this figure) the LDMOS transistor channel becomes inverted and "turns on". Current enters the drain contact through the second metal layer 20

(shown by the interior dotted line) from other circuitry on the die or an external power supply and travels within the entire metal layer 20. Current is transferred back and forth between the first metal layer and the second metal layer 20 through the pattern of vias 38 with spacings 37 separating contacts 39 and vias 38 to provide regions of maximum metal thickness. The system provides more uniform current distribution eliminating regions of simultaneous high voltage and high current (high power). These features greatly improve a transistor's SOA and electromigration performance.

Current enters the drain diffusions 28 through a pattern of drain contacts 39. This allows current to enter different areas of the drain diffusion 28 uniformly. The alternating pattern of vias 38 and contacts 39 separated by spacings 37 of FIG. 8 ensure that the transistor conducts more uniformly, hence providing current ballasting, by carrying the current through the metal layers over the active drain busing region. The inventive plurality of patterned, alternating contacts 39 and vias 38 separated by spacings 37 acts as a resistive ladder network providing current ballasting through the conductive layers and allows the transistor to conduct current through the inverted channel more uniformly. Uniform transistor switching is important since current density increases dramatically in localized areas causing thermal failures when a transistor switches in a nonuniform manner as is well known and understood by those skilled in the art of integrated circuit design. This problem becomes aggravated when driving inductive loads which is common in power applications. The inventive arrangement spreads out the bus structure over the face of the transistor and uniformly distributes current to and from the device, avoiding current density problems which, in turn, helps avoid electromigration failures and improve SOA performance.

It is important to note what is occurring with the source diffusions 24 of the LDMOS transistor at this time. The source diffusions 24 are shown with a source contact strip 43 along them. The source contact strips 43 allow current to flow from the source diffusion 24 and is composed of the first metal layer. The metal contact strip 43 provides a very low resistive path for current flowing between the source diffusion 24 and other components on the die. The first metal layer contacting the drain diffusions 28 and the source diffusions 24 are electrically isolated from one another. Since there are no vias in the source region the first metal layer making contact 43 to the source diffusion 24 will remain electrically isolated from the second metal layer 20. From this it can be seen how the second metal layer 20 forms the drain contact bus (the drain contact bus will, therefore, be identified with the number 20) and is able to run over the active source area while remaining electrically isolated from it. The drain contact bus 20 is able to run over active circuitry without sacrificing source resistance. This feature of being able to run a contact bus over active circuitry provides a significant reduction in transistor sizing. Prior art power transistor layouts required large bus widths to fulfill current density specification requirements. These buses, running alongside the drain and source diffusions occupied die area that could not be utilized for active circuitry. The double layer metal approach with alternating contacts and vias with spacings allows these buses to run over active circuitry, thus reducing die area. The reduction in transistor sizing is directly proportional to die sizing. An additional amount of die area can be saved in instances where multiple transistors share a similar node such as several LDMOS transistors with a common source terminal.

It should also be noted in FIG. 8a that the spacings 37 between the alternating contacts 39 and vias 38 are important in that they provide areas of maximum metal thickness of the two metal layers. At a diffusion contact 39 the first metal layer experiences thinning and at a via 38 the second metal layer experiences thinning. Metal step coverage thinning at contact points is a phenomena that is well understood by those skilled in the art. In the spacings 37 between the contacts 39 and vias 38 both metal layers are at their nominal thickness which provides a low resistive path which greatly reduces electromigration reliability concerns.

Figure 8B:
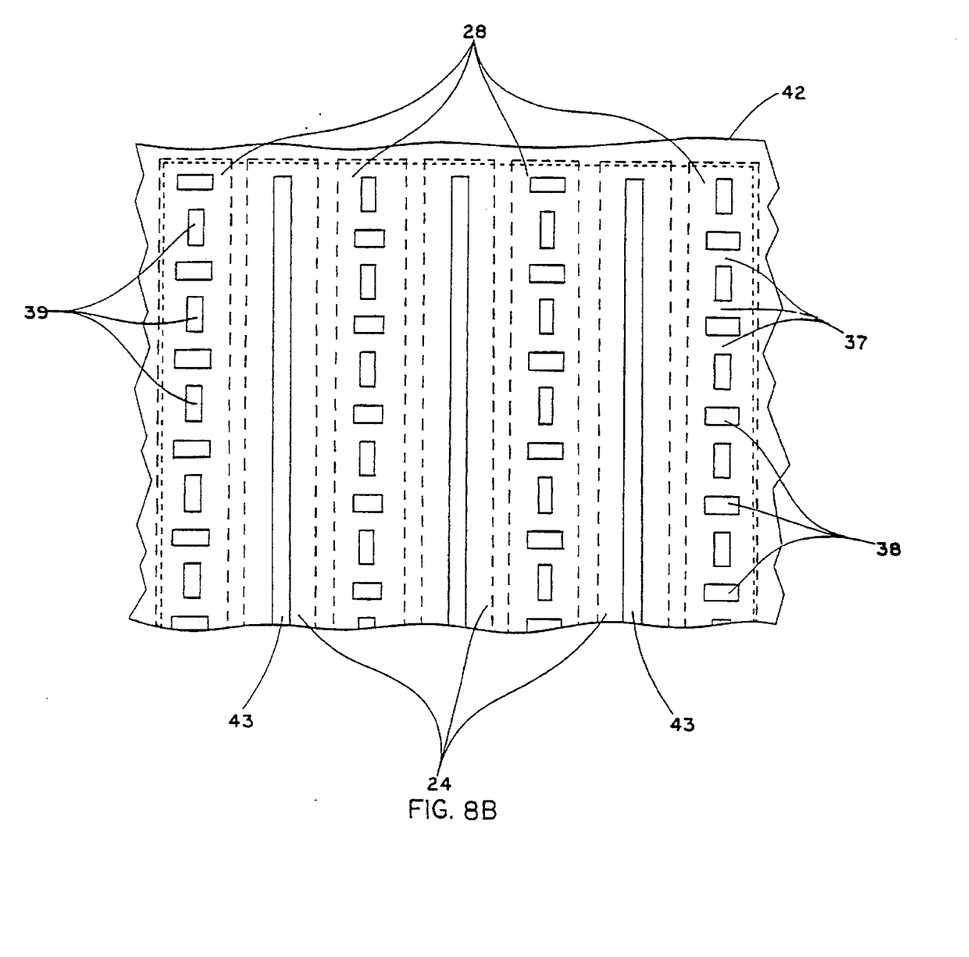
FIG. 8b is a top view drawing illustrating an alternative embodiment of the invention applied on an LDMOS transistor.

FIG. 8b is a drawing of the top view of the active drain region 42 of an LDMOS transistor incorporating an alternative embodiment of the invention. It is similar to FIG. 8a except that the rows of alternating contacts 39 and vias 38 are staggered with respect to one another. This further promotes current ballasting by forcing further redistribution of the current.

Figure 9A:
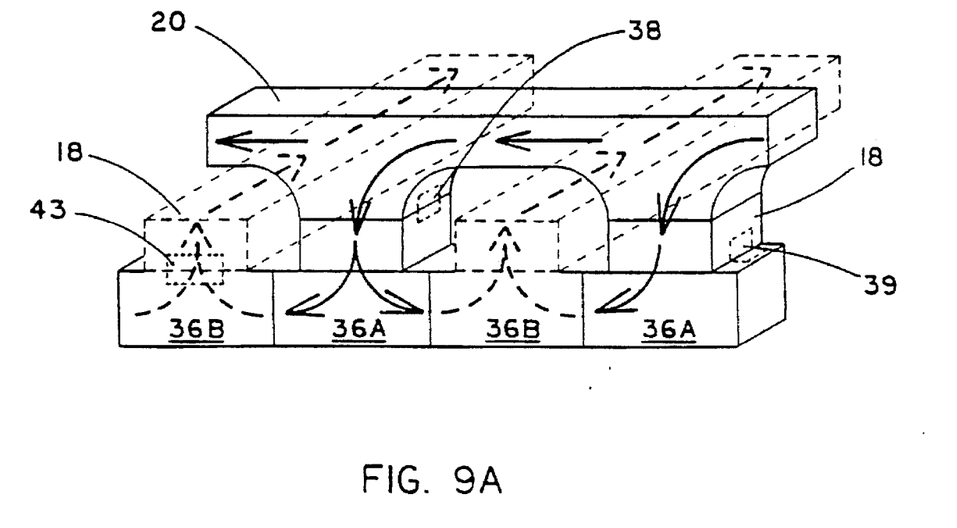
FIG. 9a is a three dimensional drawing illustrating the current flow in the preferred embodiment of the invention.

FIG. 9a is a three dimensional drawing illustrating the flow of current in the bus structure and the active circuitry 36a and 36b. The structure of the bus is not complete; however, the figure is simple to help understand the flow of current when utilizing the invention. Current enters the second metal layer 20 from other circuitry on the die or an external source and travels across the entire metal layer 20. Current also travels back and forth between the first metal layer 18 and the second metal layer 20 through the pattern of vias 38. Current enters the diffusion 36a through the series of contacts 39 along the diffusion 36a. Current then travels into the other diffusion 36b. Current enters its metal bus composed of the first metal layer 18 through a contact strip 43. Current then flows down the first metal layer 18 associated with contact strip 43 and to other components on the die, to an external connection, or its own respective active bus.

Figure 9B:
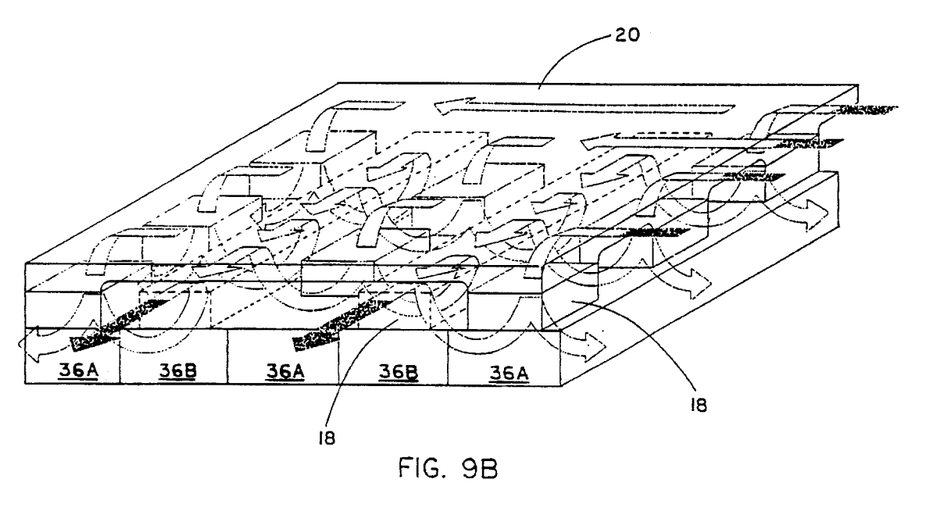
FIG. 9b is a three dimensional drawing illustrating the current flow in the preferred embodiment of the invention.

FIG. 9b is a three dimensional drawing illustrating the current flow with the various alternating contacts and vias. This drawing is significantly more complicated than FIG. 9a, but accurately illustrates the achieved current ballasting that improves the transistor's SOA and electromigration characteristics.

Figure 10:
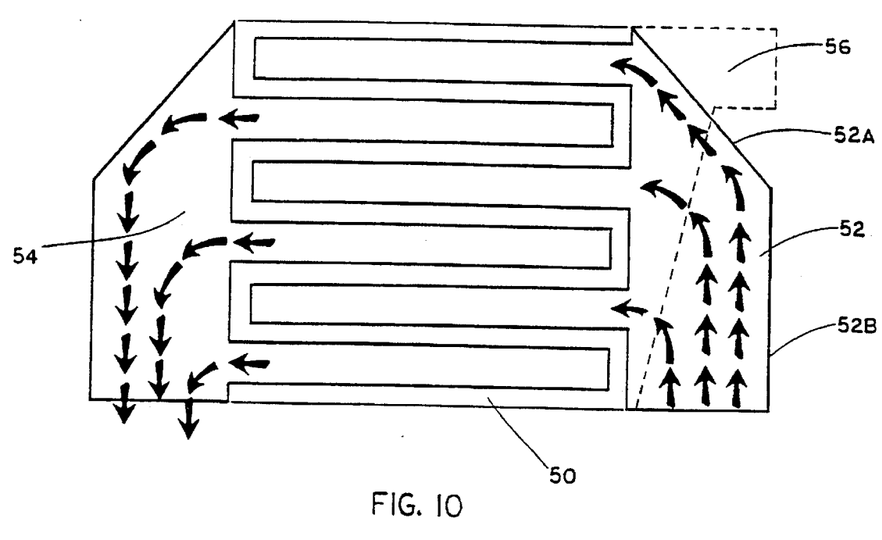
FIG. 10 is a top view drawing illustrating a prior art layout of an LDMOS power transistor.

FIG. 10 is a top view of a prior art LDMOS power transistor 50 incorporating a standard layout approach. The drain contact bus 52, for example, is a large conductive bus that receives current from a power supply rail, an external load, or other internal circuitry. It has a tapered portion 52a to meet the current density requirements. The portion 52b is where the entire current (I) enters the contact bus 52 and therefore is the widest section of the bus 52. As current (I) enters the drain diffusions of the transistor from the bus 52, less current (I) is travelling down the drain contact bus 52 and therefore less contact width is needed. Therefore, the drain contact bus 52 decreases in width and is tapered in bus portion 52a.

In FIG. 10 a similar phenomena occurs with the source contact bus 54. As current (I) leaves the source diffusions and enters the source contact bus 54 it travels down the contact bus 54. As more current (I) enters the bus 54 from different source diffusions the current (I) in the source contact bus 54 increases and the bus width accordingly increases to meet the current density requirements.

Still referring to FIG. 10, a polysilicon gate contact bus 56 typically will be laid out in the manner shown. The gate contact bus 56 is shown with a dotted line because it runs underneath the first and second metal layer which is the drain contact bus 52. Although the gate contact bus 56 does not carry the large currents that the drain contact bus 52 and source contact bus 54 do, it nevertheless needs to make contact to as many gate contacts as possible along the transistor edge to maximize uniform switching. This makes the gate contact bus 56 quite large. The capacitance associated with the polysilicon gate contact bus 56 is proportional to the gate contact bus size. Since the polysilicon is resistive, an RC time constant exists which impedes fast, uniform switching performance. Nonuniform switching is a problem referred to earlier and leads to reliability problems due to excessive current density in localized areas.

Figure 11:
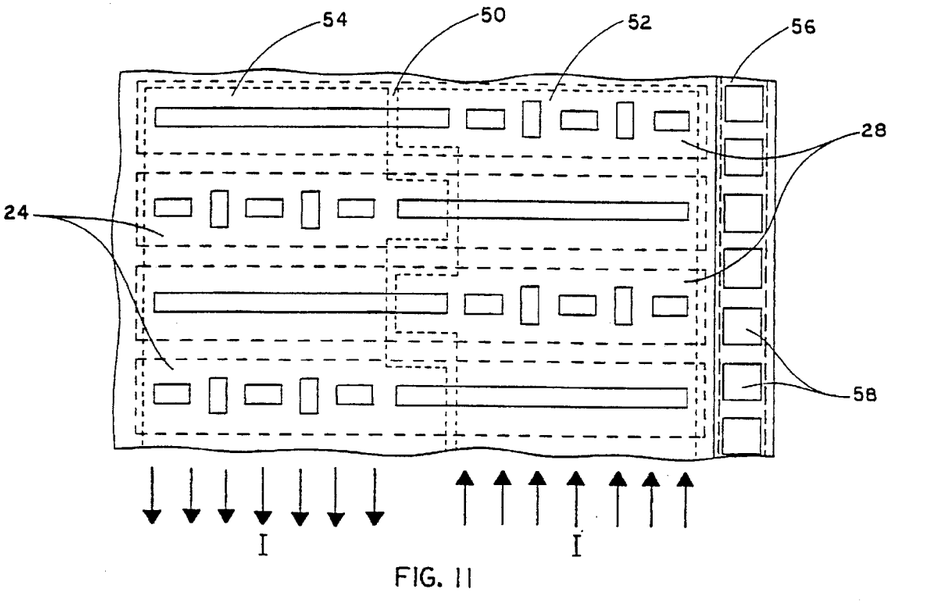
FIG. 11 is a top view drawing illustrating the preferred embodiment of the invention with emphasis on the reduced polysilicon gate contact area.

FIG. 11 is the top view of an LDMOS transistor 50 incorporating the inventive plurality of patterned, alternating contacts and vias on both the drain contact bus 52 and the source contact bus 54. Both contact buses lie over active circuit area of the transistor and are represented by dotted lines. The drain diffusions 28 and the source diffusions 24 are also shown with dotted lines; they run below the conductive contact buses. In placing the drain contact bus 52 and the source contact bus 54 over the active circuitry area neither the drain contact bus 52 width nor the source contact bus 54 width need be compromised. The active busing can be wide enough in most designs to meet electromigration requirements. Therefore, the current density requirement has been satisfied thereby eliminating electromigration as a potential reliability problem.

Note that the first metal layer makes alternating contact down to the drain diffusion 28 and up to the drain contact bus 52 on the drain contact bus 52 side of the LDMOS transistor and makes only a long single contact down to the drain diffusion 28 under the source contact bus 54 and remains electrically isolated from the source contact bus 54 on the source contact bus 54 side of the LDMOS transistor. Similarly, the contact arrangement is the same with the source diffusions 24. This illustrates selectivity of active busing to a desired contact region.

Placing the drain contact bus 52 and the source contact bus 54 over active circuit area in FIG. 11 advantageously allows the polysilicon gate contact bus 56 (shown with a dotted line) to be smaller and closer to the actual gate of LDMOS transistor 50. The shape of the gate contact bus 56 is now uniform (in this layout a long, thin rectangle). These features reduce the RC time constant, improve both switching speed and switching uniformity and also improve circuit performance and reliability.

FIG. 11 reveals that it is also now possible to construct the gate contact bus 56 with the first metal layer and make contact down to the polysilicon through contacts 58. These contacts are formed at the same time contacts to the source and drain diffusions are formed. This allows the current to travel in the gate contact bus 56 composed of the first metal layer which is less resistive than polysilicon. This was not possible in the prior art because the drain contact bus was not over active circuitry and prohibited the use of the first metal layer. Also, the capacitance that existed due to the large polysilicon area in the prior art is now significantly reduced allowing the channel of the LDMOS transistor 50 to invert more uniformly and quickly. In addition, using the first metal layer for a gate bus allows the second metal layer to pass over this bus while maintaining electrical isolation. Active busing can then be extended over the gate electrode if desired. These improvements, therefore, significantly improve the LDMOS transistors' 50 switching performance.

Although the invention has been described with reference to the preferred embodiment herein, this description is not to be construed in a limiting sense. Various modifications of the disclosed embodiment, such as device of use or current direction, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. An integrated circuit device comprising:

a semiconductor die;

an insulating layer covering the die having a pattern of etched contact openings for selective contact with conductive layers;

a first conductive layer overlying the insulating layer and making contact to the die through the etched openings in the insulating layer;

a second insulating layer overlying the first conductive layer having a pattern of etched via openings alternating with respect to the pattern of etched contact openings and wherein rows of alternating contacts and vias are staggered with respect to each other; and a second conductive layer overlying the second insulating layer making contact down to the first conductive layer through the pattern of via openings in the second insulating layer.

2. A device according to claim 1 wherein the alternating pattern of contacts and vias form a plurality of rows.

3. A device according to claim 2 wherein the rows of alternating contacts and vias have spacing between the alternating contacts and vias, whereby areas of maximum conductor thickness is achieved.

4. A semiconductor device comprising:

active circuitry formed in a face of semiconductor material;

an insulating layer overlying the active circuitry with openings selectively etched in the insulating layer;

a first conductive layer overlying the insulating layer, the first conductive layer making contact down to the active circuitry through the selective openings in the insulating layer;

a second insulating layer overlying the first conductive layer such that certain portions of the first conductive layer are electrically isolated from each other with selective openings etched in the second insulating layer;

a second conductive layer overlying the second insulating layer making selective contact down to portions of the first conducting layer through the second insulating layer and forming vias such that the second conductive layer is electrically isolated from portions of the first conductive layer and wherein the two conductive layers with contacts and vias from rows of alternating contacts and vias with spacing between the contacts and vias, and wherein the rows of alternating contacts and vias are staggered with respect to one another; and the second conductive layer forming a bus for the portion of active circuitry contacted through the contacts of the first conductive layer and the vias of the second conductive layer.

5. The semiconductor device of claim 4 wherein the first conductive layer and the second conductive layer are composed of metal.

6. A power integrated circuit device comprising:

a lateral MOS transistor disposed on an area of a semiconductor die, the MOS transistor having a plurality of source diffusions, a plurality of drain diffusions, and a plurality of polysilicon gates;

a first insulating layer overlying the MOS transistor with a pattern of openings selectively etched to provide contact down to the plurality of drain diffusions, the plurality of source diffusions, and a plurality of polysilicon gates;

a first conductive layer overlying the first insulating layer making electrical contact down to the plurality of drain diffusions, the plurality of source diffusions, and the plurality of polysilicon gates such that the plurality of drain and source diffusions, and the plurality of polysilicon gates of the MOS power transistor remain electrically isolated from one another;

the first conductive layer making contact to the plurality of polysilicon gates forming a gate contact bus along the periphery of the MOS transistor;

a second insulating layer overlying the first conductive layer having a pattern of etched via openings alternating with respect to the pattern of etched contact openings; and a second conductive layer overlying the second insulating layer making contact through the vias down to the first conductive layer such that the plurality of source diffusions and the plurality of drain diffusions make electrical contact to the second conductive layer, however, the second conductive layer coupling to the source and the drain of the MOS transistor remain electrically isolated from one another and thus form drain and source contact buses for the MOS transistor whereby die area is conserved and switching performance is improved and wherein the contacts and vias formed in the conductive layers form rows of alternating contacts and vias with spacings between the contacts and vias and wherein the rows of alternating contacts and vias with spacings between them are staggered with respect to one another.

7. An integrated circuit device comprising:

active circuitry formed in the face of a semiconductor material with a plurality of transistor devices sharing a common circuit node;

an insulating layer overlying the active circuitry with openings etched in the insulating layer for contact down to the active circuitry;

a conductive layer overlying the insulating layer making contact down to the active circuitry through the contact openings in the insulating layer such that the plurality of transistor devices sharing a common node are making electrical contact and the remaining portions of active circuitry remain electrically isolated from one another;

a second insulating layer overlying the conductive layer with openings etched in the second insulating layer for selective contact down to the conductive layer making electrical contact to the common node of the plurality of transistor devices sharing a common node; and a second conductive layer overlying the second insulating layer making electrical contact down to the first conductive layer through the etched openings in the second insulating layer thus making electrical contact to the common node of the plurality of transistor devices sharing a common node and becoming the bus for the common node over active circuitry and wherein the contacts and vias on the common node of the plurality of transistor devices sharing a common node have an alternating pattern of contacts and vias in rows with spacings between the contacts and vias, and wherein the rows of alternating contacts and vias with the spacings between the contacts and vias have the rows staggered with respect to one another.

* * * * *